US006479845B2

United States Patent
Chen

(10) Patent No.: US 6,479,845 B2
(45) Date of Patent: Nov. 12, 2002

(54) PATTERN FOR ROUTING POWER AND GROUND FOR AN INTEGRATED CIRCUIT CHIP

(75) Inventor: Ker-Min Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/946,984

(22) Filed: Sep. 6, 2001

(65) Prior Publication Data

US 2002/0048923 A1 Apr. 25, 2002

Related U.S. Application Data

(62) Division of application No. 09/666,318, filed on Sep. 21, 2000, now Pat. No. 6,306,745.

(51) Int. Cl.[7] .............................................. H01L 27/118
(52) U.S. Cl. ...................... 257/211; 257/205; 257/209; 257/210; 257/506; 257/691; 257/758; 257/207
(58) Field of Search ................................ 257/202, 203, 257/207, 208, 264, 206, 341, 211, 758, 691, 506, 205, 209, 210, 379; 438/599, 587, 107, 108, 129, 548, 612, 613, 6

(56) References Cited

U.S. PATENT DOCUMENTS 5,313,079 A    5/1994  Brasen et al. ............... 257/206
5,517,042 A    5/1996  Kitamura .................... 257/207
5,949,098 A *  9/1999  Mori .......................... 257/211
6,025,616 A    2/2000  Nguyen et al. ............. 257/207

* cited by examiner

Primary Examiner—Stephen D. Meier
Assistant Examiner—Khanh B. Duong
(74) Attorney, Agent, or Firm—George O. Saile; Stephen B. Ackerman; Larry J. Prescott

(57) ABSTRACT

A method of routing power supply voltage electrodes and reference voltage electrodes which makes efficient use of chip area, maximizes decoupling capacitance, and reduces voltage drops due to electrode resistance is described. The two top wiring layers of an integrated circuit chip are used as power distribution layers to distribute the power supply voltage and reference voltage so that the power supply voltage bus electrode and reference voltage bus electrode are in separate wiring layers. The chip is partitioned into a number of sub-blocks with spaces between the sub-blocks. In a first wiring layer the power supply voltage bus electrode is routed so as to surround each of the sub-blocks. In a second wiring layer the reference voltage bus electrode is routed so as to surround each of the sub-blocks. Distribution electrodes for both the power supply voltage and reference voltage are located in both the first wiring layer and the second wiring layer and distribute the power supply voltage and reference voltage to each of the sub-blocks. Vias are used to connect distribution electrodes on one level to the same voltage distribution electrodes on the other level and to either the main bus for the power supply or the main bus for the reference voltage.

5 Claims, 8 Drawing Sheets

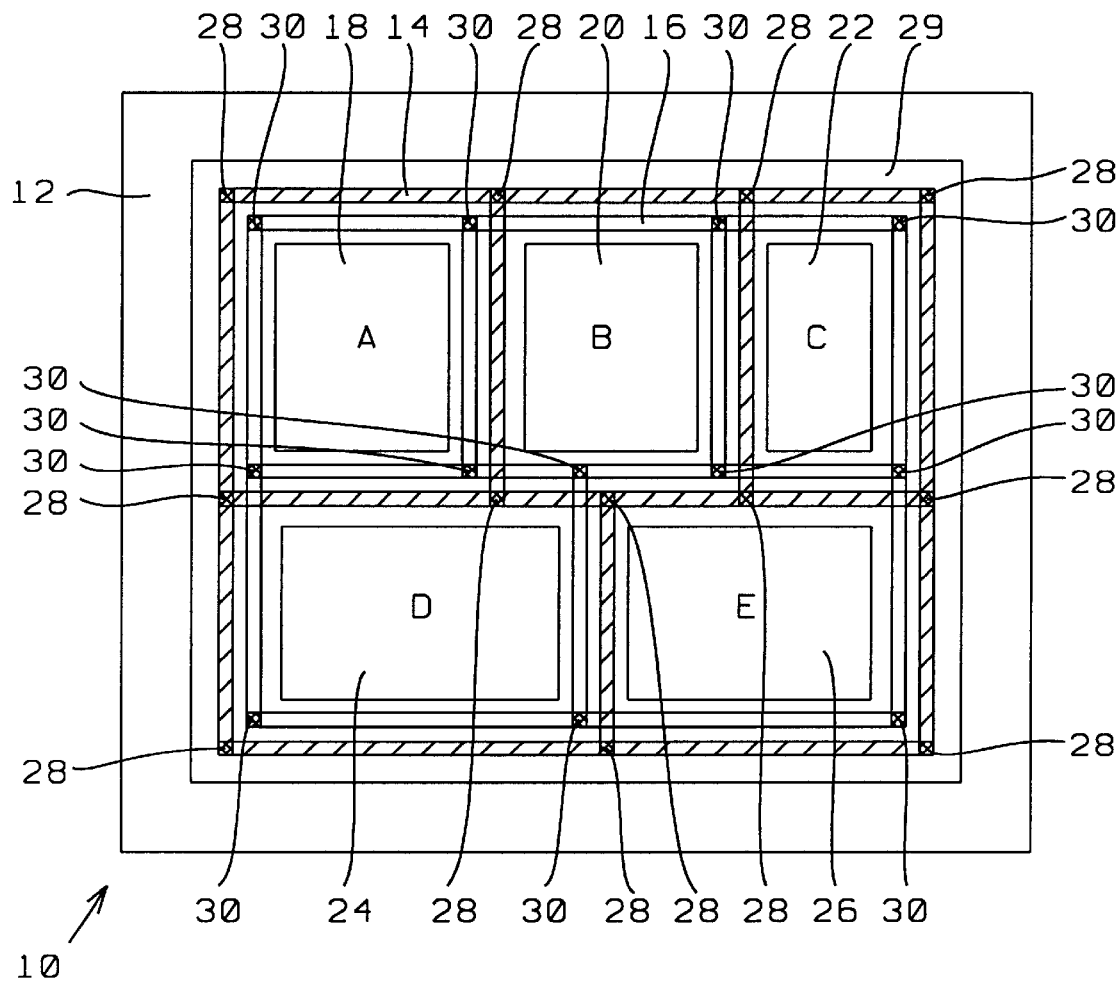
FIG. 1 – Prior Art

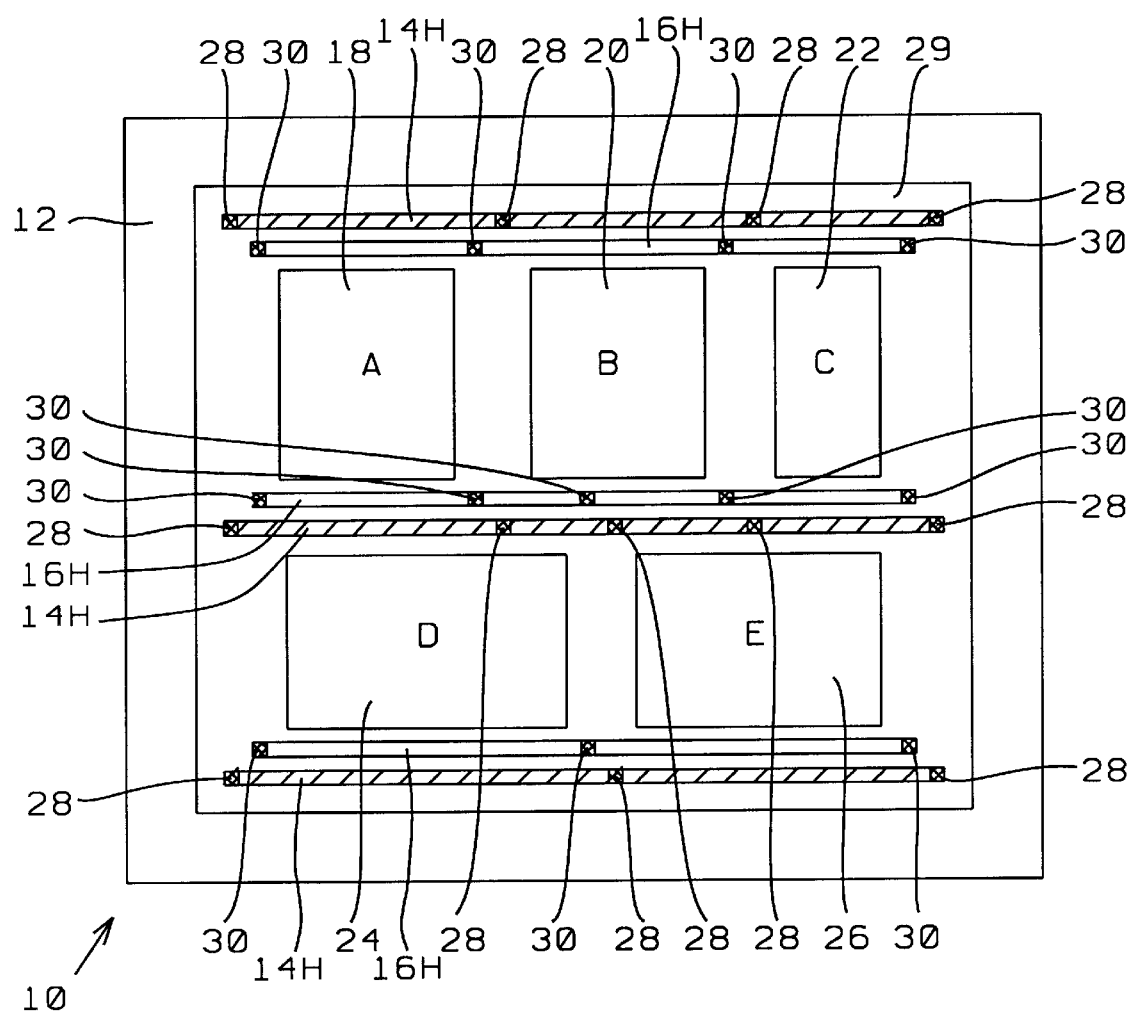
FIG. 2 – Prior Art

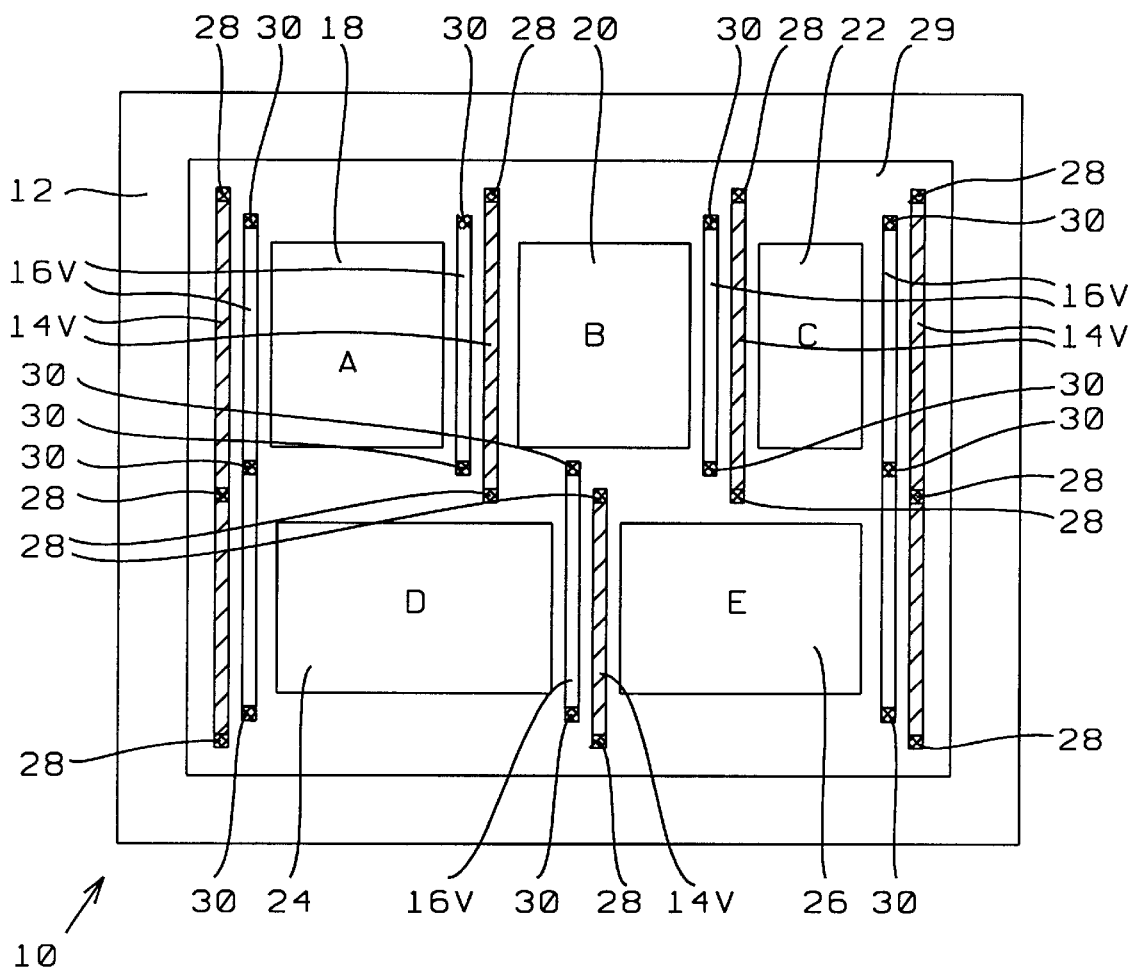
FIG. 3 – Prior Art

PATTERN FOR ROUTING POWER AND GROUND FOR AN INTEGRATED CIRCUIT CHIP

This is a division of patent application Ser. No. 09/666,318, filing date Sep. 21, 2000, now U.S. Pat. No. 6,306,745 Chip-Area-Efficient Pattern And Method Of Hierarchal Power Routing, assigned to the same assignee as the present invention.

BACKGROUND OF THE INVENTION (1) Field of the Invention

This invention relates to a method and pattern for routing power and ground for an integrated circuit chip.

(2) Description of the Related Art

Distribution of a power supply voltage and a reference voltage to an integrated circuit chip is a key part of the chip wiring layout design. Voltages must be distributed to all parts of the chip within strict voltage drop tolerances. Capacitance between the electrodes supplying the power and reference voltages can also be an important consideration.

U.S. Pat. No. 6,025,616 to Nguyen et al. describes a power distribution system for a semiconductor die which includes bonding pads located adjacent to and connected to power busses with connections to the bonding pads providing a parallel path for current.

U.S. Pat. No. 5,949,098 to Mori describes a semiconductor integrated circuit having a power wiring layer and a ground wiring layer with an insulating layer between the power and ground layers.

U.S. Pat. No. 5,313,079 to Brasen et al. describes gate arrays having functional blocks with flexible power routing.

U.S. Pat. No. 5,517,042 to Kitamura describes a semiconductor device having first and second device regions, a first power supply region, and a second power supply region.

SUMMARY OF THE INVENTION

With large chips and dense circuitry becoming common it is important to provide power and ground routing which will make very efficient use of chip area, reduce voltage drops due to electrode resistance, and provide decoupling capacitance between the power and ground supply electrodes.

Currently the general practice in routing the top level power and ground is to form the power and ground electrodes from the same metal layer. While more than one metal layers may be used to distribute power and ground, each metal layer has both power and ground electrodes. This conventional arrangement is shown in FIGS. 1–3. FIG. 1 shows a composite top view of a chip 10 having a circuit region 29 partitioned into five separate sub-blocks, sub-block A 18, sub-block B 20, sub-block C 22, sub-block D 24, and sub-block E 26. The chip 10 has a peripheral region 12 for input output tabs, not shown. The chip has a power bus 14 and a ground bus 16. FIG. 1 is a composite top surface view showing the wiring for two separate metal layers. The electrodes in the horizontal direction are in one metal layer and the electrodes in the vertical direction are in another wiring layer. The inter layer contacts for the power bus 14 are shown as darkened regions 28. The inter layer contacts for the ground bus are also shown as darkened regions 30.

FIG. 2 shows the metal layer having the power bus electrodes 14H and the ground bus electrodes 16H in the horizontal direction. FIG. 3 shows the metal layer having the power bus electrodes 14V and the ground bus electrodes 16V in the vertical direction.

This arrangement results in power and ground routed in parallel electrodes in the same metal which restricts the width of the power and ground busses and provides very little decoupling capacitance between the power and ground electrodes. For large chips and dense circuitry the current practice results in significant voltage drop due to the resistance of long power and ground electrodes and insufficient decoupling capacitance between power and ground electrodes.

It is a principle objective of this invention to provide a method of routing power and ground wiring which makes efficient use of chip area, reduces voltage drops due to electrode resistance, and provides increased decoupling capacitance between power and ground electrodes.

It is another principle objective of this invention to provide a power and ground wiring layout which makes efficient use of chip area, reduces voltage drops due to electrode resistance, and provides increased decoupling capacitance between power and ground electrodes.

These objectives are achieved by using the two top wiring layers as power distribution layers to distribute the power supply voltage, such as $V_{DD}$, and reference voltage, such as ground or $V_{SS}$, so the power supply voltage bus electrode and the reference voltage bus electrode are on separate wiring levels. The power supply voltage bus electrode and the reference voltage bus electrode are in adjacent wiring layers and in the same location on the chip so that decoupling capacitance between the power supply voltage bus electrode and reference voltage bus electrode is maximized. Since the power supply voltage bus electrode and the reference voltage bus electrode are in separate wiring layers the width of these electrodes can be maximized to reduce the voltage drop due to the resistance of the electrodes.

BRIEF DESCRIPTION OF THE DRAWINGS

FIG. 1 shows a composite top view of a chip having a conventional power and ground distribution system.

FIG. 2 shows a top view of the wiring level having electrode routing in the horizontal direction for a chip having a conventional power and ground distribution system.

FIG. 3 shows a top view of the wiring level having electrode routing in the vertical direction for a chip having a conventional power and ground distribution system.

DESCRIPTION OF THE PREFERRED EMBODIMENTS

Refer now to FIGS. 4A–6B for a description of the preferred embodiments of this invention. This invention relates to the distribution of the power supply voltage, such as $V_{DD}$, and the reference voltage, ground or $V_{SS}$, in an integrated circuit chip. This invention applies to any integrated circuit chip, but is particularly useful for those chips having five or more wiring layers. A key element of this invention is that the power supply voltage, such as $V_{DD}$, bus electrode is located in a single wiring layer and the reference voltage, ground or $V_{SS}$, bus electrode is also located in a single and separate wiring layer.

Figure 4A:
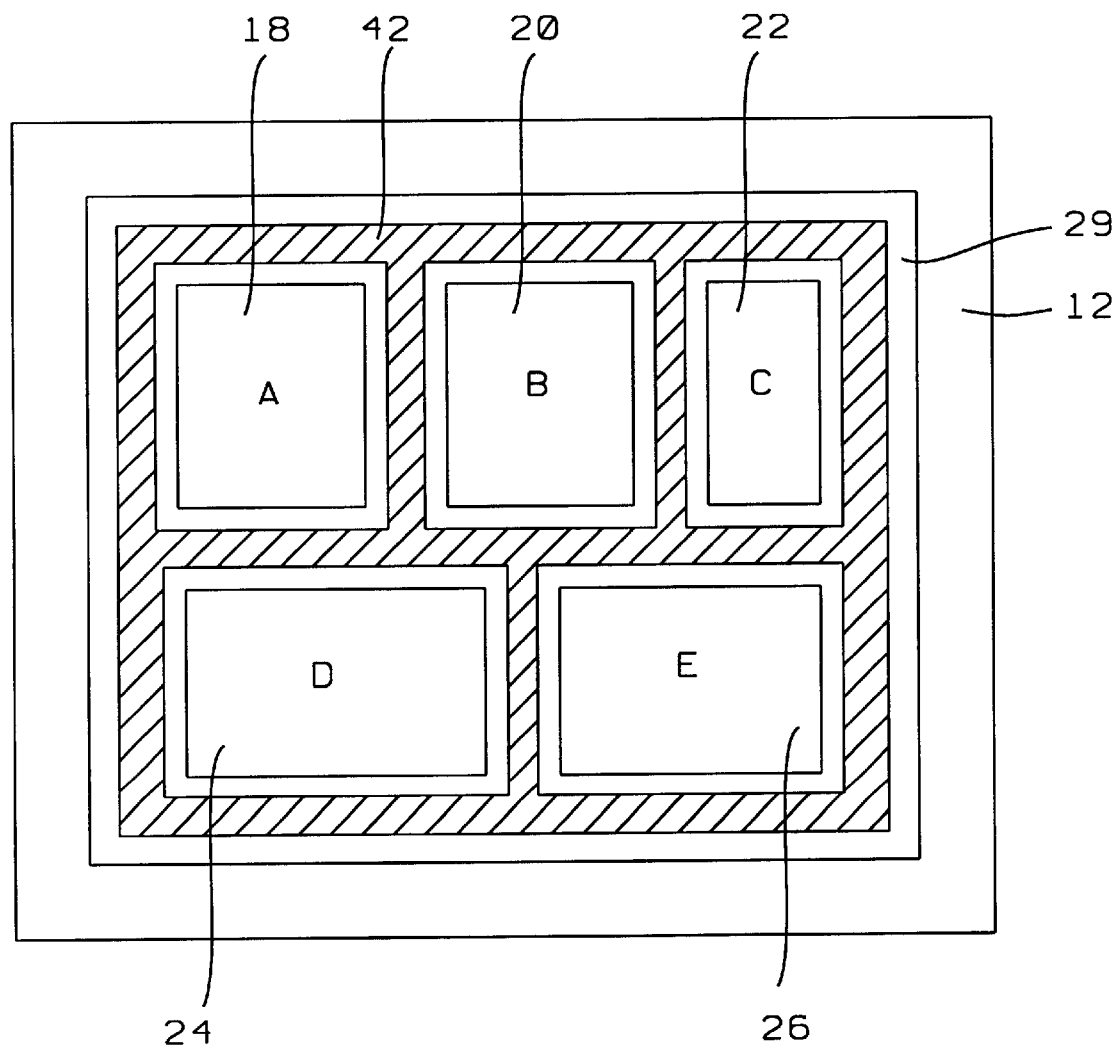
FIG. 4A shows a top view of the first power bus electrodes in the first power wiring layer for a chip having the power and ground wiring layout of this invention.
Figure 4B:
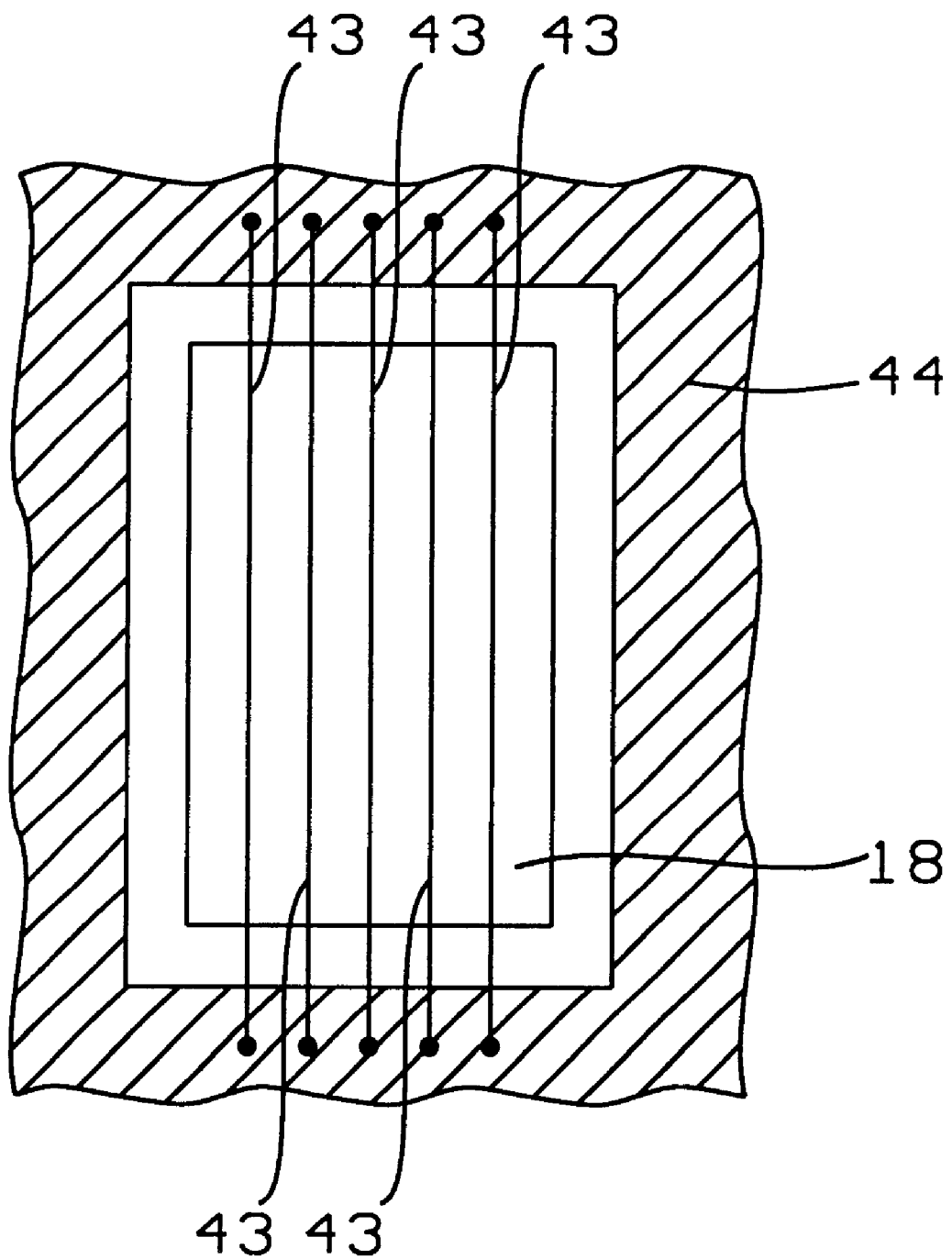
FIG. 4B shows a top view of the second power bus electrodes in the second power wiring layer for a chip having the power and ground wiring layout of this invention.
Figure 6A:
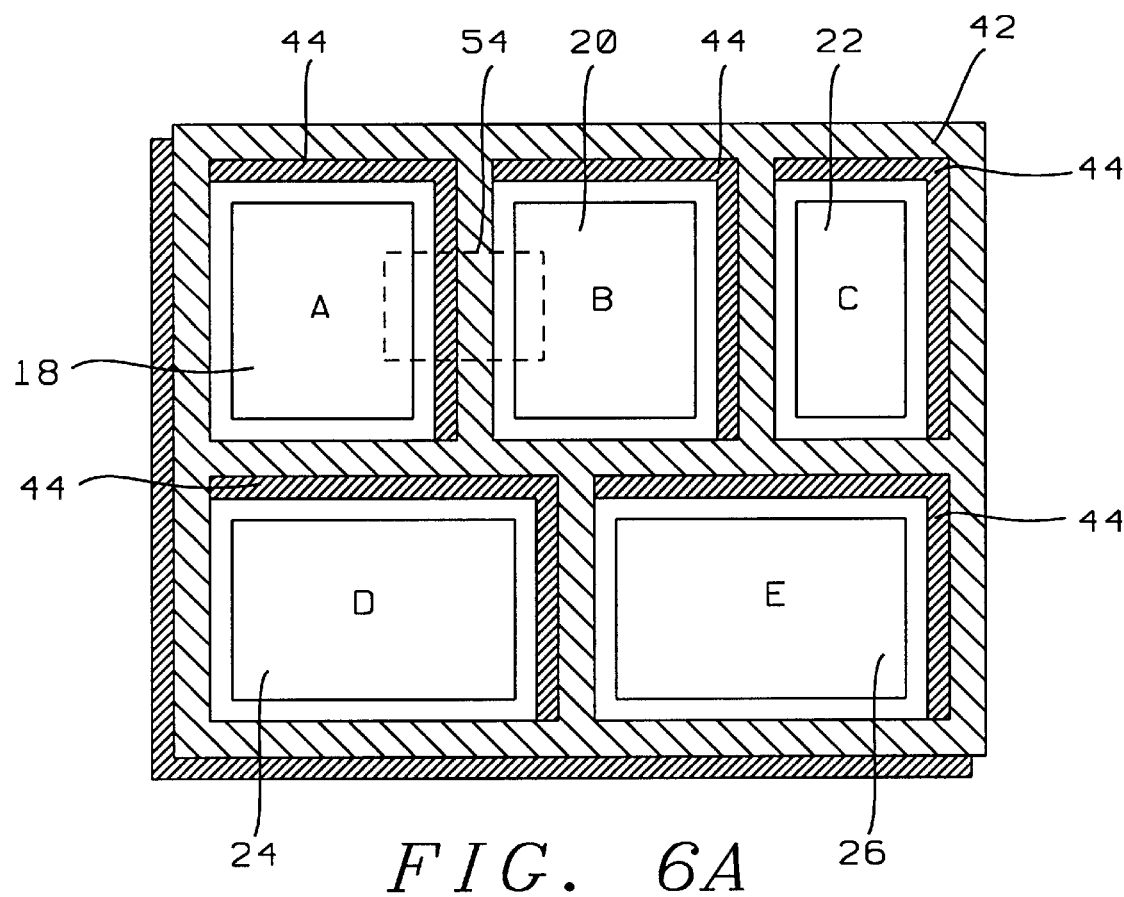
FIG. 6A shows a three dimensional view of the first and second power bus electrodes in the first and second power wiring layers for a chip having the power and ground wiring layout of this invention.

In this invention, as shown in FIGS. 4A, 4B, and 6A, the chip is first partitioned into a number of sub-blocks with wiring space between the sub-blocks. In this example the circuit region 29 of the chip is partitioned into sub-block A 18, sub-block B 20, sub-block C 22, sub-block D 24, and sub-block E 26. As shown in FIGS. 4A, 4B, and 6A there are wiring spaces between the sub-blocks. Also shown in FIGS. 4A and 4B there is a space 12 around the periphery of the circuit region 29 of the chip for input output pads, not shown. Although five sub-blocks are shown in this example those skilled in the art will readily recognize that a larger-or smaller number of sub-blocks could be used.

FIGS. 4A and 4B show the top views of the main electrodes used to distribute the power supply voltage, or $V_{DD}$, and the reference voltage, ground or $V_{SS}$. In this example FIG. 4A shows the power supply voltage bus electrode 42 and FIG. 4B shows the reference voltage bus electrode 44. The power supply voltage bus electrode 42, FIG. 4A, and the reference voltage bus electrode 44, FIG. 4B, are in separate wiring layers. In this example the wiring layer having the power supply voltage bus 42, shown in FIG. 4A, will be referred to as the first wiring layer and the wiring layer having the reference voltage bus 44, shown in FIG. 4B, will be referred to as the second wiring layer. Typically the first wiring layer and the second wiring layer are adjacent wiring layers. As shown in FIG. 4A the power supply voltage bus electrode 42 is routed around each of the sub-blocks and in each of the spaces between the sub-blocks. The power supply voltage bus electrode 42 is shown cross hatched in FIG. 4A to improve the clarity of the drawing. As shown in FIG. 4B the reference voltage bus electrode 44 is routed around each of the sub-blocks and in each of the spaces between the sub-blocks. The reference voltage bus electrode 44 is-shown shaded in FIG. 4B to improve the clarity of the drawing.

The power supply voltage bus electrode 42, shown in FIG. 4A, and the reference voltage bus electrode 44, shown in FIG. 4B, have the same size, shape, and location within their wiring layer so that one is located directly above the other in adjacent wiring levels. This maximizes the decoupling capacitance between the power supply voltage bus electrode 42 and the reference voltage bus electrode 44. Since the power supply voltage bus electrode 42 and the reference voltage bus electrode 44 are each located on a separate wiring layer the width of these electrodes can be maximized thereby minimizing the voltage drop due to resistance of these electrodes. Those skilled in the art will readily recognize that either the power supply voltage bus electrode 42 can be located above the reference voltage bus electrode 44, or the reference voltage bus electrode 44 can be located above the power supply voltage bus electrode 42.

Figure 5A:
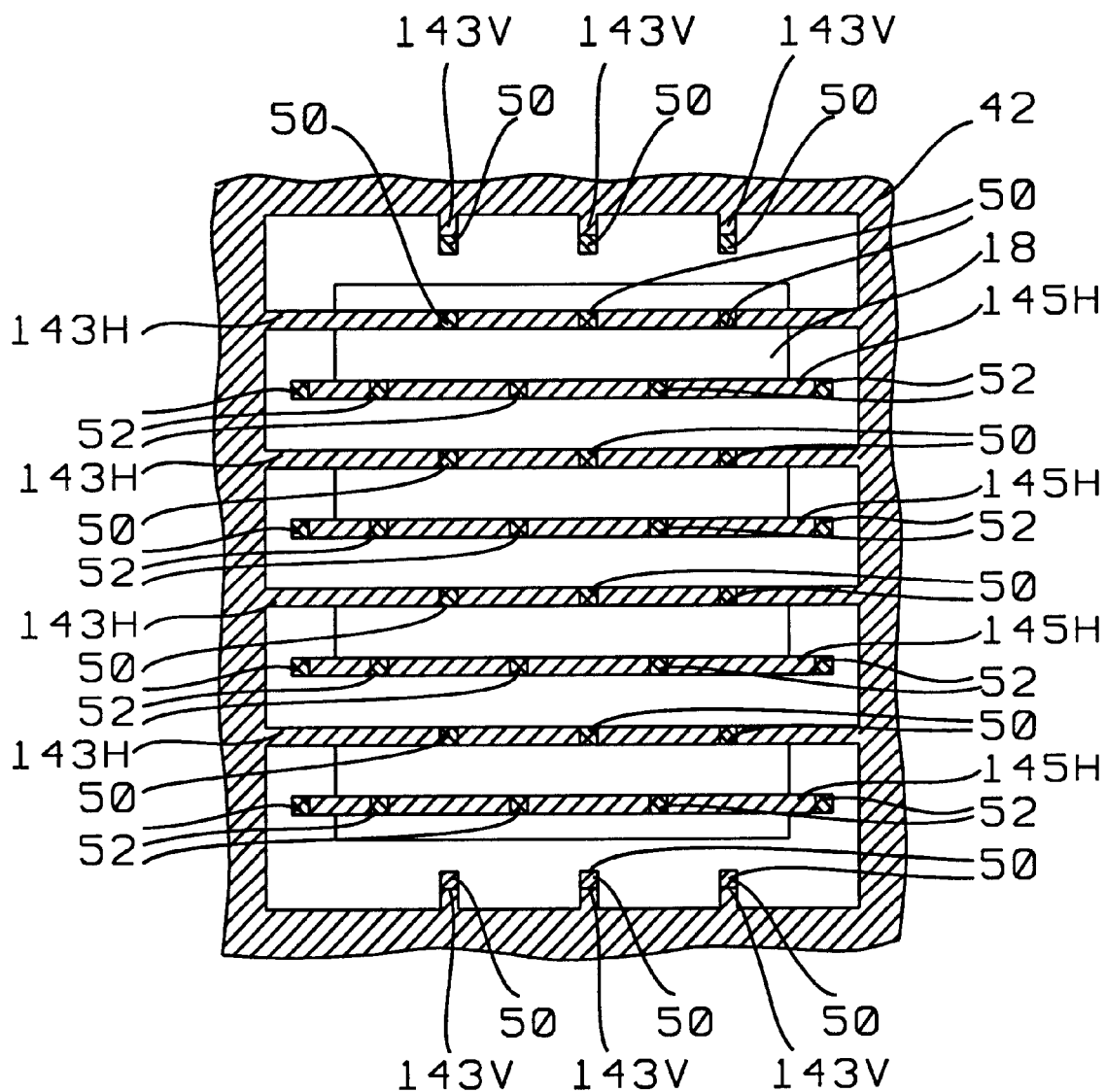
FIG. 5A shows a top view of the distribution electrodes in the first power wiring layer for a chip having the power and ground wiring layout of this invention.
Figure 5B:
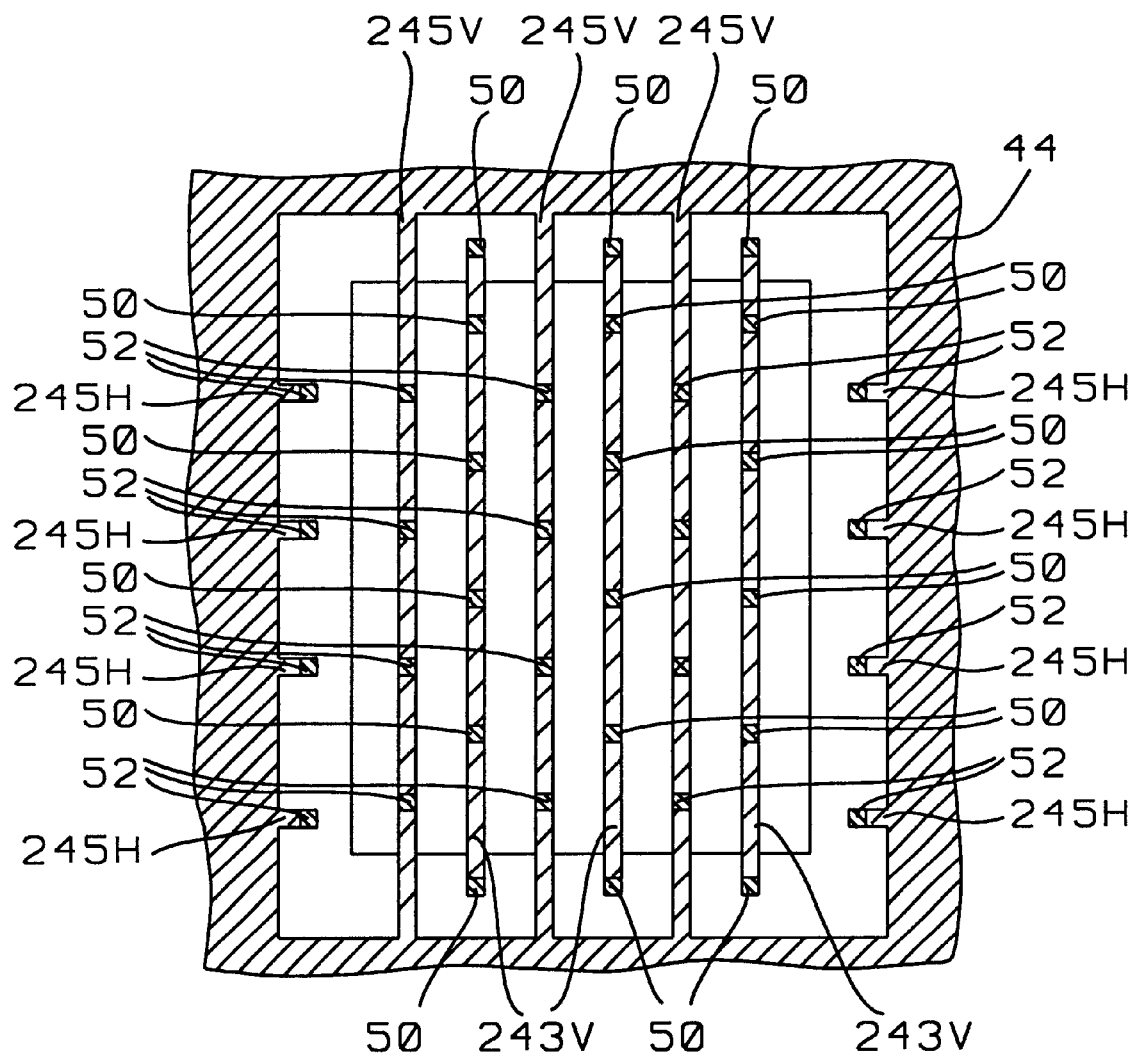
FIG. 5B shows a top view of the distribution electrodes in the second power wiring layer for a chip having the power and ground wiring layout of this invention.

FIG. 5A shows the top view of the power supply voltage distribution electrodes, 143H and 143V, and the reference voltage distribution electrodes 145H in the first wiring layer used to distribute the power supply voltage, or $V_{DD}$, and the reference voltage, ground or $V_{SS}$, into the sub-blocks. FIG. 5B shows the top view of the power supply voltage distribution electrodes 243V and the reference voltage distribution electrodes, 245V and 245H, in the second wiring layer used to distribute the power supply voltage, or $V_{DD}$ and the reference voltage, ground or $V_{SS}$, into the sub-blocks. While the power supply voltage bus electrodes and the reference voltage bus electrodes are in separate wiring layers, there are both power supply voltage distribution electrodes and reference voltage distribution electrodes in both the first wiring layer and the second wiring layer. In FIGS. 5A and 5B sub-block A 18 is used as a representative example. Those skilled in the art will readily recognize that the power supply voltage, or $V_{DD}$, and the reference voltage, ground or $V_{SS}$, will be distributed to the remaining sub-blocks in like manner.

FIG. 5A shows the power supply voltage distribution electrodes, 143H and 143V, and reference voltage distribution electrodes 145H in the first wiring layer. FIG. 5B shows the power supply voltage distribution a electrodes 243V and reference voltage distribution electrodes, 245V and 245H, in the second wiring layer. As shown in FIGS. 5A and 5B, first vias 50 are used to connect the power supply voltage bus 42 and the power supply voltage distribution electrodes, 143H and 143V, on the first wiring layer to the power supply voltage distribution electrodes 243V on the second wiring layer. Also as shown in FIGS. 5A and 5B, second vias 52 are used to connect the reference voltage bus 44 and the reference voltage distribution electrodes, 245H and 245V, on the second wiring layer to the reference voltage distribution electrodes 145H on the first wiring layer.

Figure 6B:
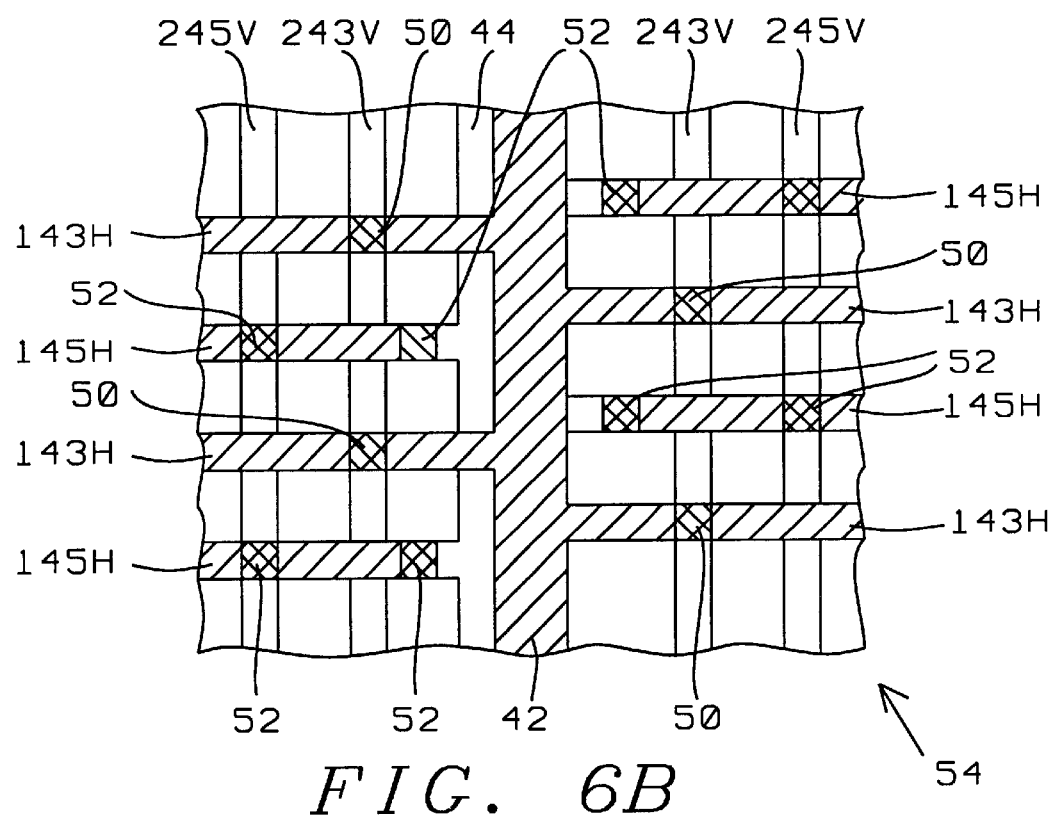
FIG. 6B shows a three dimensional view of the distribution electrodes in the first and second power wiring layers for a chip having the power and ground wiring layout of this invention.

Refer to FIGS. 6A and 6B for a further description of the electrode routing in the first wiring layer and the second wiring layer. FIG. 6A shows a three dimensional view of the first and second wiring layers. FIG. 6A shows the power supply voltage bus electrode 42 located directly over the reference voltage bus electrode 44. In FIG. 6A the power supply voltage bus electrode 42 is shown cross-hatched and the reference voltage bus electrode 44 is shown shaded to aid in the clarity of the drawing. FIG. 6B shows the detail of the distribution into sub-block A 18 and sub-block B 20 for the region 54 identified by the dashed is line.

In FIG. 6B the electrodes on the first wiring level are shown cross-hatched and the electrodes on the second wiring level are shown without cross-hatching or shading. As shown in FIG. 6B the reference voltage bus electrode 44 on the second wiring layer is connected to reference voltage distribution electrodes 145H on the first wiring layer through second vias 52. Also as shown in FIG. 6B the power supply voltage bus electrode 42 on the first wiring layer is connected to power supply voltage distribution electrodes 243H on the second wiring layer through first vias 50. Also as shown in FIG. 6B, the power supply voltage distribution electrodes 143H on the first wiring layer are connected to the power supply distribution electrodes 243V on the second wiring layer through first vias 50, and the reference voltage distribution electrodes 243V on the second wiring layer are connected to the reference voltage distribution electrodes 143H on the first wiring layer through second vias 52.

FIGS. 5A, 5B, and 6B show the power supply voltage distribution electrodes and reference voltage distribution electrodes on the first wiring layer oriented horizontally, and the power supply voltage distribution electrodes and reference voltage distribution electrodes on the second wiring layer oriented vertically. Those skilled in the art will readily recognize that the invention will work equally well if the power supply voltage distribution electrodes and reference voltage distribution electrodes on the first wiring layer were oriented vertically, and the power supply voltage distribution electrodes and reference voltage distribution electrodes on the second wiring layer were oriented horizontally.

While the invention has been particularly shown and described with reference to the preferred embodiments thereof, it will be understood by those skilled in the art that various changes in form and details may be made without departing from the spirit and scope of the invention.

What is claimed is:

1. A power and ground routing pattern for an integrated circuit chip, comprising:

an integrated circuit chip, wherein said integrated circuit chip has devices formed therein, a first number of signal wiring layers, and a circuit region partitioned into a second number of sub-block regions having spaces therebetween;

a first cap dielectric layer formed on said integrated circuit chip thereby covering said first number of signal wiring layers;

a first power wiring layer formed on said first cap dielectric layer;

a second cap dielectric layer formed on said first power wiring layer;

a second power wiring layer formed on said second cap dielectric layer;

a plurality of first vias between said first power wiring layer and said second power wiring layer;

a plurality of second vias between said first power wiring layer and said second power wiring layer;

a first power bus electrode formed in said first power wiring layer wherein said first power bus electrode surrounds said circuit region and each of said sub-block regions;

a second power bus electrode formed in said second power wiring layer wherein said second power bus electrode is directly under said first power bus electrode, surrounds said circuit region, and surrounds each of said sub-block regions;

first distribution electrodes formed in said first power wiring layer electrically connected to said first power bus electrode wherein said first distribution electrodes supply the voltage on said first power bus electrode to each of said sub-block regions;

second distribution electrodes formed in said second power wiring layer electrically connected to said first power bus electrode and said first distribution electrodes by means of said first vias wherein said second distribution electrodes supply the voltage on said first power bus electrode to each of said sub-block regions;

third distribution electrodes formed in said second power wiring layer electrically connected to said second power bus electrode wherein said third distribution electrodes supply the voltage on said second power bus electrode to each of said sub-block regions; and fourth distribution electrodes formed in said first power wiring layer electrically connected to said second power bus electrode and said third distribution electrodes by means of said second vias wherein said fourth distribution electrodes supply the voltage on said second power bus electrode to each of said sub-block regions.

2. The power and ground routing pattern of claim 1 wherein said first number is five or greater.

3. The power and ground routing pattern of claim 1 wherein said first power bus electrode is connected to a voltage supply and said second power bus electrode is connected to electrical ground.

4. The power and ground routing pattern of claim 1 wherein said first power bus electrode is connected to a $V_{DD}$ voltage supply and said second power bus electrode is connected to a $V_{SS}$ voltage supply.

5. The power and ground routing pattern of claim 1 wherein said second number is five.

* * * * *